(12) United States Patent
Griesing et al.

(10) Patent No.: US 6,903,910 B1
(45) Date of Patent: Jun. 7, 2005

(54) SHIELDED ENCLOSURE WITH USER-INSTALLABLE INTERFACE MODULES

(75) Inventors: John Robert Griesing, Sudbury, MA (US); Francis Fothergill, Reading, MA (US); Derek Jasnoch, Leominster, MA (US); Steven A. Mulawski, Tyngsborough, MA (US)

(73) Assignee: Azijuth Networks, Inc., Acton, MA (US)

( * ) Notice: Subject to any disclaimer, the term of this patent is extended or adjusted under 35 U.S.C. 154(b) by 0 days.

(21) Appl. No.: 10/912,823

(22) Filed: Aug. 6, 2004

(51) Int. Cl.[7] ................................................ H02H 7/04
(52) U.S. Cl. ........................................ 361/38; 361/142
(58) Field of Search ...................... 361/38, 212, 142, 361/816, 818; 174/35 R

(56) References Cited

U.S. PATENT DOCUMENTS

| | | | |
|---|---|---|---|
| 4,868,716 A | 9/1989 | Taylor et al. ............... 361/424 |
| 4,962,358 A | 10/1990 | Svetanoff .................... 324/627 |
| 5,062,148 A | 10/1991 | Edwards ....................... 455/52 |
| 5,252,782 A | 10/1993 | Cantrell et al. ........... 174/35 R |
| 5,329,414 A | * 7/1994 | Kratt et al. .................... 361/64 |
| 5,465,393 A | 11/1995 | Frostrom et al. .......... 455/54.1 |
| 5,566,055 A | 10/1996 | Salvi, Jr. .................... 361/816 |
| 5,627,834 A | 5/1997 | Han et al. .................... 370/241 |
| 5,794,128 A | 8/1998 | Brockel et al. ............. 455/67.1 |
| 5,805,667 A | 9/1998 | Alvarez et al. ................. 379/1 |
| 5,862,455 A | 1/1999 | Martin et al. .............. 455/67.7 |
| 5,893,031 A | 4/1999 | Hoogerwerf et al. ....... 455/410 |
| 6,052,583 A | 4/2000 | Bernardin .................... 455/423 |
| 6,088,582 A | 7/2000 | Canora et al. ........... 455/226.1 |
| 6,104,585 A | * 8/2000 | Matsui et al. ................. 361/38 |
| 6,128,474 A | 10/2000 | Kim et al. .................. 455/67.1 |
| 6,262,870 B1 | * 7/2001 | Yumoto ....................... 361/38 |
| 6,308,064 B1 | 10/2001 | Green ........................ 455/423 |
| 6,308,072 B1 | 10/2001 | Labedz et al. .............. 455/448 |
| 6,314,000 B1 | 11/2001 | Johnson ...................... 361/816 |
| 6,360,621 B1 | 3/2002 | Eldred et al. .............. 73/865.6 |
| 6,571,082 B1 | 5/2003 | Rahman et al. ............ 455/67.1 |
| 6,657,214 B1 | 12/2003 | Foegelle et al. ......... 250/506.1 |
| 6,788,510 B2 | * 9/2004 | McConaughy ............. 361/91.1 |

\* cited by examiner

Primary Examiner—Hung V. Ngo
(74) Attorney, Agent, or Firm—David D. Lowry; Brown Rudnick Berlack Israels LLP

(57) ABSTRACT

An RF shielded enclosure that is configurable for a variety of testing requirements, yet still maintain proper RF isolation. User-installable modules that are specialized for the desired interface, ventilation or monitoring use can be installed on the enclosure to allow interfacing between a device under test installed inside the chamber and testing and controlling equipment outside the enclosure. The enclosure is easy to manufacture as a one or multi-chamber enclosure, allowing further flexibility for testing.

44 Claims, 10 Drawing Sheets

SHIELDED ENCLOSURE WITH USER-INSTALLABLE INTERFACE MODULES

FIELD OF THE INVENTION

This invention is directed towards radio frequency (RF) equipment testing, and more particularly towards shielded enclosures for testing RF devices.

BACKGROUND

The use of RF communications has vastly increased in recent years, in everything from cellular telephony, satellite communications and geographic position information, and data communications. As an example of data communications, wireless computer network communication systems have become less expensive to implement and maintain, and they are becoming more prevalent and more widely used to communicate data among nodes of a local area network (LAN).

As the supply of RF devices and protocols increases, so does the need to be able to test such equipment in controlled environments. However, current methods for testing RF communication equipment still present several problems. Testing methods typically range from simply setting up the test in an open air environment, to connecting the wireless equipment together via cables, to assembling test setups disposed within RF shielded rooms or enclosures.

When testing radio equipment, it is common to place a device under test (DUT) into a shielded enclosure so that it is isolated from other potentially interfering radio signals. To provide sufficient isolation of the DUT, the enclosure completely surrounds the DUT, and the enclosure cover or door is tightly closed during tests. RF ports are typically provided in the enclosure to allow intended radio signals to pass between the interior and exterior. Other than the ports, all RF signals must be blocked. This isolation requirement presents several problems.

One problem is that a DUT can generate a considerable amount of heat in normal operation. Even seemingly low power devices, when placed in an environment where the air is not free to circulate, can get very warm, endangering the electronics.

Another problem is that the DUT often requires an external power supply; hence electric power must also pass through the enclosure walls to reach the DUT. Since interfering RF signals can be carried on the power conductors, the power source must be filtered to block these signals.

A further problem is that many DUTs require some means of remote control. Additional specialized ports in the enclosure are needed for conveying control signals while blocking interfering RF signals.

Commercially-available enclosures do not provide enough flexibility or return on investment to the customer. The enclosures are either highly specialized in their electrical interfaces, or too general to be convenient. For instance, one may purchase an enclosure that has a filtered and isolated RS-232 serial interface built into it. This is a perfect match for DUTs with an RS-232 interface. However, if the customer would now like to use the enclosure to test a device that has, for instance, an Ethernet interface, the RS-232 interface is now a liability. The customer must now buy a new enclosure, one designed with Ethernet isolation in mind.

One alternative is to design an enclosure with multiple filtered or isolated electrical interfaces. However, this adds cost, for the customer may have to purchase a product that has numerous unused interfaces just to get the two or three they really need. There is an additional risk that sometime in the future this enclosure will become obsolete because a new interface, not supported by the existing general enclosure, becomes popular.

Another alternative is to provide a general means for the customer to convey any signal they need through the enclosure wall. This exists in the form of a circular filtering waveguide, essentially a metal tube of the proper diameter and length. This method is simple and general, but has several drawbacks. The first is a simple practical issue: the diameter and length of the waveguide depends on the highest frequency that needs to be blocked. This can limit the number and type of cables that can be passed through the waveguide.

The second issue is more serious. To truly isolate the interior from the exterior RF environment, the cables must be fiber optic. The waveguide is designed to block radiated signals, not conducted signals. Metallic cables act like antennas and pick up RF radiation in the environment and carry it through the waveguide, thereby defeating its purpose. For this reason, the waveguide technique, while seeming to be general solution, is very inconvenient and limiting, for the customer must further purchase the appropriate specialized optically-isolated interface mechanisms. This can be expensive, and can require further interface tradeoffs.

A similar situation exists with ventilation. The customer may need to purchase an enclosure with one or more fans, yet not need the fans for every test situation. The fans can be turned off, but being permanently mounted with the enclosure means the fans add cost to the enclosure, and can increase the space required for the enclosure. Additional enclosure functionality, such as a temperature monitor for the enclosure interior is in the same situation.

For these reasons, there is a need for a shielded enclosure that can provide great flexibility in the signals it can pass into out of the enclosure, but avoid the great expense of providing for all possible signal paths, along with the issue of changing interface requirements.

SUMMARY

The present invention includes a shielded enclosure that is configurable for a variety of testing requirements, yet still maintain proper RF isolation. An illustrative embodiment includes an enclosure that allows greater flexibility of customer configuration without requiring the customer to replace the entire shielded enclosure whenever the DUT interface requirements change. The enclosure includes user-installable modules that are specialized for the desired interface, ventilation or monitoring use.

The manufacturer supplies the enclosure to the customer along with whatever interface modules the customer feels they currently need. As needs change, the customer can purchase and install additional modules without degrading the isolation performance of the enclosure. As new interface standards are adopted, the manufacturer need only design new modules for their customers, at a much reduced cost to both.

The illustrative embodiment can efficiently hold small devices, such as wireless access points, or wireless handsets. Another embodiment includes an enclosure that is suitable for holding laptops, or, with a simple manufacturing step, can be suitably built for holding and accessing two access points independently. The present invention can advantageously hold one laptop or two smaller devices in a same rack-mounted space, allowing a higher density of devices (both DUTs and other devices) in the test system.

An embodiment of the present invention includes an enclosure for RF isolation of a space inside the enclosure from space outside the enclosure, including an access door on the enclosure, the access door providing access to the space inside the enclosure. At least one interface module is positioned on the enclosure, the interface module including at least one path for signals to pass from the space outside the enclosure to the space inside the enclosure, wherein the interface module maintains RF isolation of at least one frequency band of the space inside the enclosure from the space outside the enclosure; and wherein the interface module is removably mountable on the enclosure. This interface module can be removed and replaced by a second interface module, the second interface module including at least one path for signals that are different from the removed interface module. The enclosure this embodiment includes at least one RF connection port, to provide a path for RF signals to pass between the space outside the enclosure and the space inside the enclosure.

The embodiment can include a separation wall disposed within the space inside the enclosure, the separation wall dividing the space inside the enclosure into two separate, RF isolated chambers. A first interface module provides access to the first RF isolated chamber, and a second interface module provides access to the second RF isolated chamber.

Another embodiment is directed towards a system for interconnecting multiple electrical signal paths while providing RF isolation. It includes a first connector, to connect to a plurality of electrical signal paths; a second connector, to connect to a second plurality of electrical signal paths; a first signal path from the first connector to a first isolation transformer component, wherein the first signal path, after passing through the first isolation transformer component, then passes through a low pass filter component, and wherein the signal path continues to a second isolation transformer component, and, after passing through the second isolation transformer component, the signal path connects to the second connector. A center tap on the first isolation transformer component includes a second signal path through a low pass filter component, and then to a center tap on the second isolation transformer component. The first signal path, after passing through the first isolation transformer component, then passes through a first low pass filter component, then passes through an isolation wall, then through a second low pass filter component, and then continues to the second isolation transformer component.

This embodiment can also include wherein the second signal path passes through a first low pass filter component, then through an isolation wall, then through a second low pass filter component, and then continues to a center tap on the second isolation transformer component. The low pass filter component on the first signal path can include a cutoff frequency higher than a cutoff frequency on the low pass filter component on the second signal path. This second low pass filter component can be an off the shelf low pass filter. The second signal path allows a DC current to pass through the system. This embodiment is useful for POE (power over Ethernet) signals, but is applicable to other signals and data exchange formats.

This embodiment can also include a setup wherein the first signal path passes through a plurality of RF isolation chambers, and wherein the first and second isolation transformer components are positioned in separate ones of the plurality of RF isolation chambers. Further, the low pass filter component can also be positioned in one the plurality of RF isolation chambers separate from the first and second isolation transformer components.

Another embodiment is directed towards an interface module, for passing a predetermined signal without RFI, including a plurality of internal chambers, the chambers including RF isolating walls; a signal path, passing through each of the plurality of internal chambers; and RF filtering components along the signal path, wherein the RF filtering components are located in different ones of the plurality of internal chambers. It includes a printed circuit board including a ground plane, wherein the printed circuit board forms one of the RF isolating walls to at least one of the plurality of internal chambers. The printed circuit board includes pass through vias to create shielded tunnels to allow the signal path to pass from one of the internal chambers to another internal chamber.

This interface module is formed using two identical shell components, wherein the shell components are positioned together with the printed circuit board in between, thereby creating the plurality of internal chambers.

BRIEF DESCRIPTION OF THE DRAWINGS

The foregoing and other features and advantages of the present invention will be more fully understood from the following detailed description of illustrative embodiments, taken in conjunction with the accompanying drawings in which.

DETAILED DESCRIPTION

Figure 1:
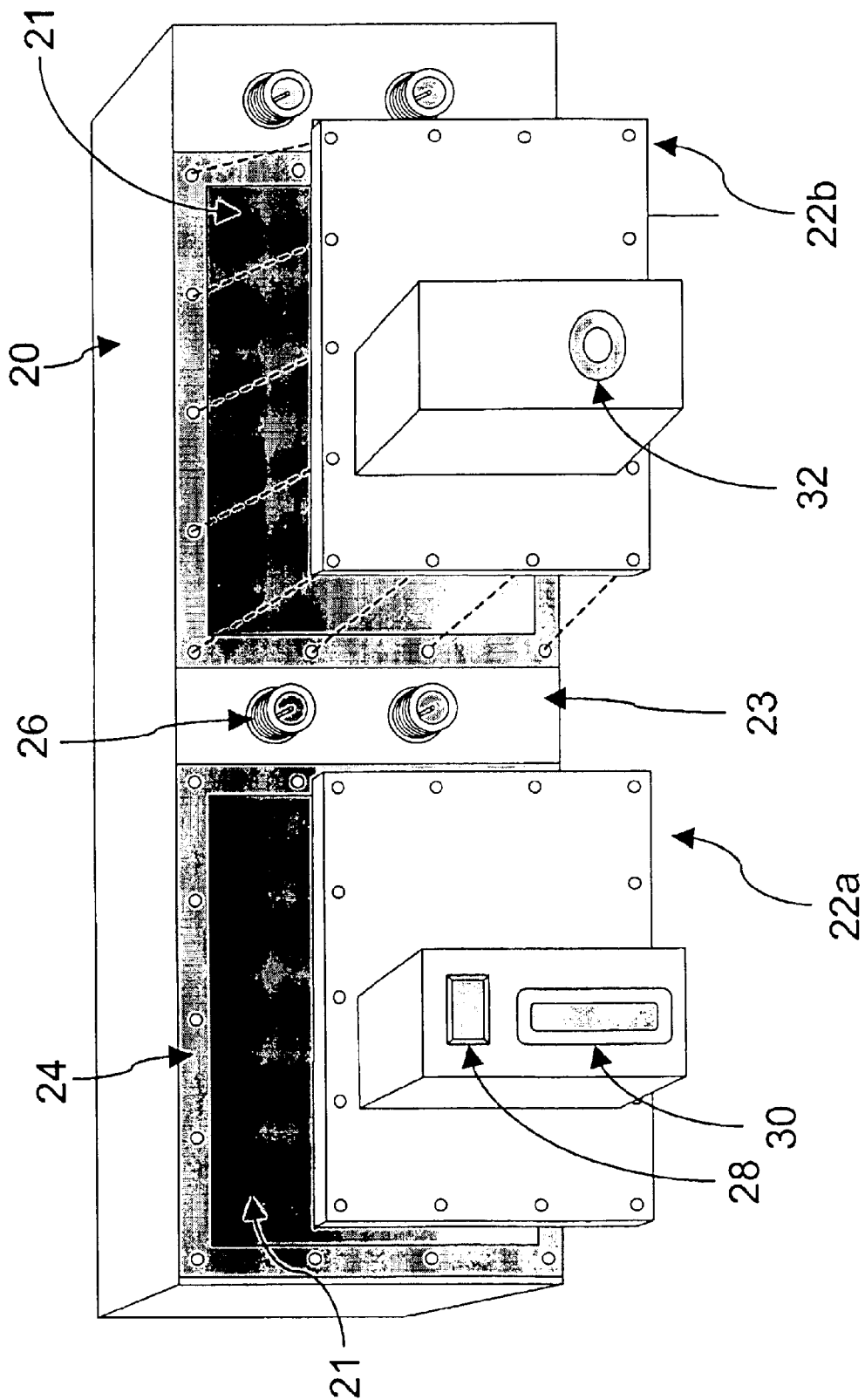
FIG. 1 illustrates an embodiment of the enclosure with selectable interface modules according to the present invention.

The present invention is directed towards an RF shielded enclosure that is configurable for a variety of testing requirements, yet still maintain proper RF isolation. Some uses for such a test chamber are described in co-owned U.S. Pat. No. 6,724,730 entitled TEST SYSTEM FOR SIMULATING A WIRELESS ENVIRONMENT AND METHOD OF USING SAME, which is fully incorporated herein by reference. The present invention includes an RF shielded enclosure with the ability to mount one or more selectable interface modules. An illustrative embodiment is shown in FIG. 1. The shielded enclosure 20 has two openings 21 cut out of the rear wall 23, and provisions made to attach one or more specialized filtering/isolation modules 22 to cover the openings. Around the edge of the openings, a compressible RF sealing material 24 is affixed so that when the modules 22 are attached to the enclosure, RF energy cannot leak through the opening. The sealing connection at the openings may also have different geometries such as tongue and grooved designs, to further prevent RF leakage. The present invention can include more or fewer openings 21, with extra unused openings sealed with a metallic plate, or some type of RF blocking mesh to allow air flow but prevent leakage of RF energy. The modules may be attached by screws, slide-in slot, or any other sealing means that provides an RF-tight seal, and may include a quick release feature to allow easy changing of modules 22.

The enclosure 20 also includes one or more RF connectors 26 to allow an RF connection to the DUT (Device Under Test) inside the enclosure, and to a connection cable to the RF connectors outside of the enclosure. The RF connectors 26 are typically mounted separately from the modules 22, although RF connectors can also be included on the modules 22. RF connectors on the enclosure 20 that are not used can be capped with a RF-proof cap to prevent RF leakage.

The replaceable modules include various connectors 28, 30, 32, to allow the connection of the specified interface, as will be described below. The type of connector is dictated by the interface. A similar set of connectors are located on the inside panel of the module 22 (not shown), to allow the interface to be connected to the DUT.

The replaceable modules 22 are designed for specific interface applications. Some examples of common interfaces are:

10BASE-2 Ethernet
10/100/1000BASE-T Ethernet over CAT-5cable with POE (Power Over Ethernet; a means of powering Ethernet-based devices using conductors in the CAT-5 cable)
RS-232 serial link
VGA/SVGA video display link
PS-2 PC keyboard and mouse
Universal Serial Bus (USB)
IEEE-1394 ("Firewire") high speed serial interface
Telephony signals (e.g., baseband telephone, ISDN, T1, etc.)
AC or DC electric power
Signals for Logic analyzers, spectrum analyzers, or oscilloscopes
Digital Diagnostic Interface
Background Debug Mode
Fiber optic signal paths (e.g. 100BASE-FX)

The modules 22 may also provide environmental monitoring sensors, including but not limited to temperature, humidity, barometric pressure, vacuum, light, sound measurement, vibration, smoke, etc. The modules may also include equipment to alter all such environmental factors, for example heating or cooling elements to change the temperature inside the enclosure, vacuum actuators, sound or vibration injectors, RF interference signal injection, etc. The modules 22 may also include ventilation screens or mesh to allow air flow (both natural and fan assisted) into the enclosure while still blocking RFI. It may also include observation windows or ports to allow viewing of devices within the enclosure, for example to observe if a device under test is functioning, dead, or combusting. Other types of signal interfaces or environmental monitoring/altering systems are included within the scope of the present invention.

The modules 22 can be created with any combination of the above. For example, a PC (personal computer) interface module 22 might have keyboard, mouse and video display interfaces. A power supply or power supply interface may also be included. As another example, an interface module would have an Ethernet and a USB interface, to cover a typical set of DUTs a certain industry would be testing.

Other possibilities include a module 22 with a fan for cooling the DUT, the fan could be manually activated or automatically activated through monitoring of the interior temperature of the enclosure 20. For this design, specially designed grilles are built into the enclosure 20 or module 22 that block radio signals, yet still allow air to pass. Similarly, grills or holes may be built into other portions of the enclosure 20, including in the top door, such grills or holes to allow the flow of air but block RFI. Modules 22 can also be designed to allow a user to view inside the enclosure, for example to visually confirm a DUT such as a cell phone is responding. For this approach the module 22 (or the enclosure 20) would include a panel with glass combined with an appropriate mesh screen to block appropriate RF radiation.

Figure 2:
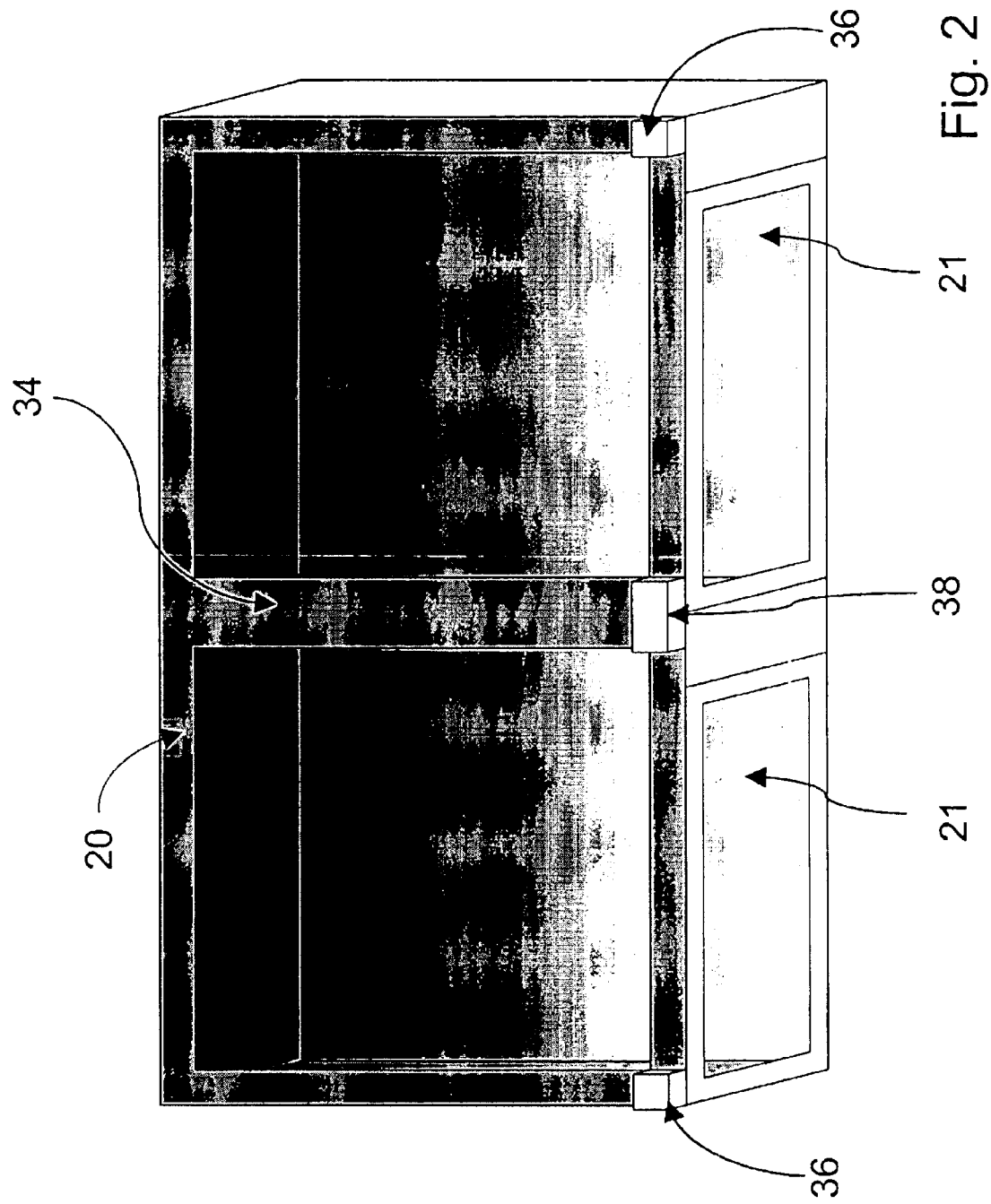
FIG. 2 is a top view of an enclosure similar to the enclosure of FIG. 1.

Another embodiment of the present invention is an enclosure with an interior wall to create two independent chambers. FIG. 2 shows a view of a dual chamber enclosure 20, with a solid interior wall 34 separating the enclosure in half. Hinge mount structures 36 and 38 allow separate covers to be secured or removed independently, and without affecting the isolation of the other chamber. Alternatively one cover may provide access to both chambers. Otherwise this embodiment of the enclosure 20 is similar to the previous embodiment in that openings 21 allow the attachment of specific modules for each chamber. Depending on the requirements of the tester, a dual chamber system may be beneficial. For example a tester might want a single chamber enclosure that suitable for testing a laptop computer with an installed wireless LAN device, while the dual chamber enclosure is suitable for testing two wireless access points. A tester testing cell phone devices might want the dual chamber enclosure.

Although FIG. 2 shows the wall 34 dividing the enclosure into two equally sized chambers, other sized chambers are possible, for example one larger chamber to hold larger DUTs with a smaller chamber for smaller DUTs. Further, the interior surface of wall 34 can be lined with RF absorbing material.

The simplicity of manufacturing made possible by this enclosure design lowers the overall cost of the enclosure for the customer. The design of the enclosure means that there are few differences in the manufacturing steps between a single and dual chamber enclosure. For the single chamber enclosure, there is no wall and no center hinge mount. To create a dual chamber enclosure, only the center wall needs to be added. The chamber covers are manufactured separately. The one remaining difference between the single and dual chamber enclosures is the RF gasketing, which is added in a relatively simple, final step.

Yet another embodiment of the present invention includes an enclosure which gives a tester the option of installing a separator wall within the enclosure, to effectively divide the enclosure into two chambers, as previously described. The removable wall would be properly sealed within the enclosure by guides, RF gasketing and attaching mechanisms to provide the required level of RF isolation between two chambers.

The modules 22 for interfacing perform the function of blocking passage of both radiated and conducted RF signals (i.e., electromagnetic interference or RFI) while allowing interface signals to pass with little or no degradation. As previously described, metallic cables that pass through the wall of a shielded enclosure will act like antennas and pick up RF radiation from the environment. The RF signals are carried through the enclosure wall on the cable, hence defeating the purpose of the enclosure. Using 100BASE-T Ethernet signals as an example, when testing wireless LAN equipment, it is very common to need to pass Ethernet signals through a shielded enclosure. This is can be done using fiber optic repeaters, or alternatively to filter the Ethernet signals directly, as shown in FIG. 3.

Figure 3:
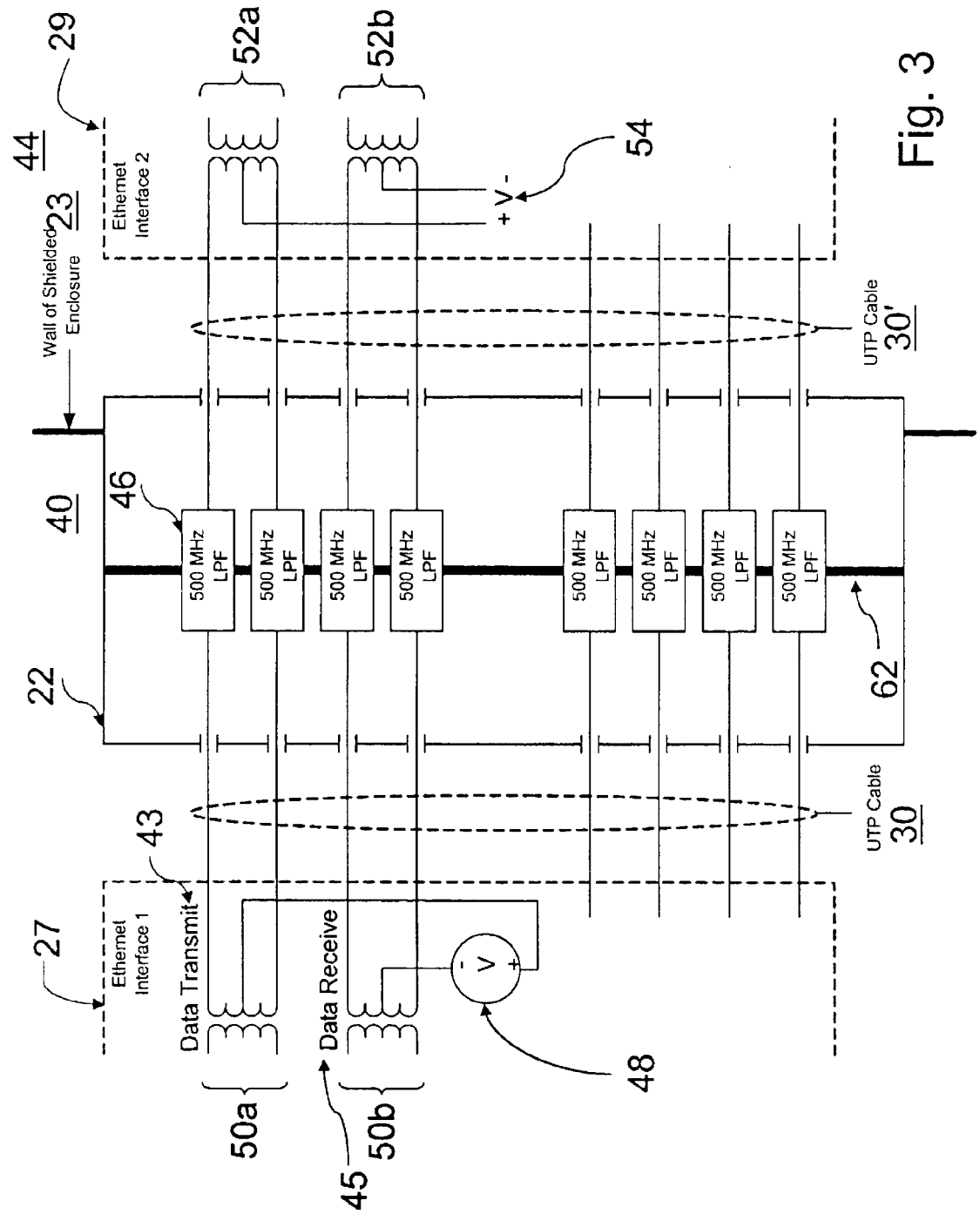
FIG. 3 illustrates an example Ethernet interface circuit for an illustrative embodiment.

FIG. 3 shows the setup for a module to filter Ethernet signals. The module 22 is mounted within the wall 23 of the enclosure, with the outside indicated by 40 and the inside of the enclosure indicated by 44. Although shown as mounted within the wall 23, the module 22 may also be mounted on either side of wall 22, with an opening in wall 23 just large enough to accommodate a connector to pass signals. For this example, the module 22 connects between a first Ethernet transceiver 27 outside the enclosure 20, and a second Ethernet transceiver 29 located within the enclosure 20 and typically connected to the device under test within the enclosure 20. The circuit design shown is for an Ethernet interface that is a POE source. It could be an Ethernet switch or bridge that adheres to the 802.3af (POE) standard. Connectors 30 and 30' allow cable connections to be connected outside and inside the enclosure. Electric power 46 is supplied into the unshielded twisted pair (UTP) cable 30 via the isolation transformer center taps 50. The side of the diagram labeled 44 shows the transceiver part of the circuit for an Ethernet interface that receives the electric power from the POE source. Here, electric power 54 is taken from the transformer center taps 52 on the transmit 43 and receive 45 pair, and powers the Ethernet-connected device, typically located inside the enclosure 20.

Located within the module 22 is one example of an RFI filter. A simple low pass filter 46 is placed in series with each of the wires in the unshielded twisted pair (UTP) cable used for 100BASE-T Ethernet. The module 22 is contained within a metal box, creating a shielded chamber; the entire box is mounted to the wall of a shielded enclosure 20 within which a DUT is operated.

In theory, this module 22 could be used to suppress all RF energy above 500 MHz, while allowing the Ethernet signal to pass with no significant distortion. However, there is a disadvantage with this arrangement. While straightforward, it does not address the fact that POE requires that the filters 46 be able to pass a current of up to 300 mA. The filters 46 also must be able to provide rejection for frequencies up to at least 6 GHz, the upper end of the highest frequency band used by 802.11 wireless LAN equipment. Those knowledgeable in the field of microwave circuits will understand the difficulty and expense of creating such a filter. Such filters are not readily available as off the shelf components, but must be custom designed and are expensive to make. An alternate method for achieving the goal is therefore helpful.

Figure 4:
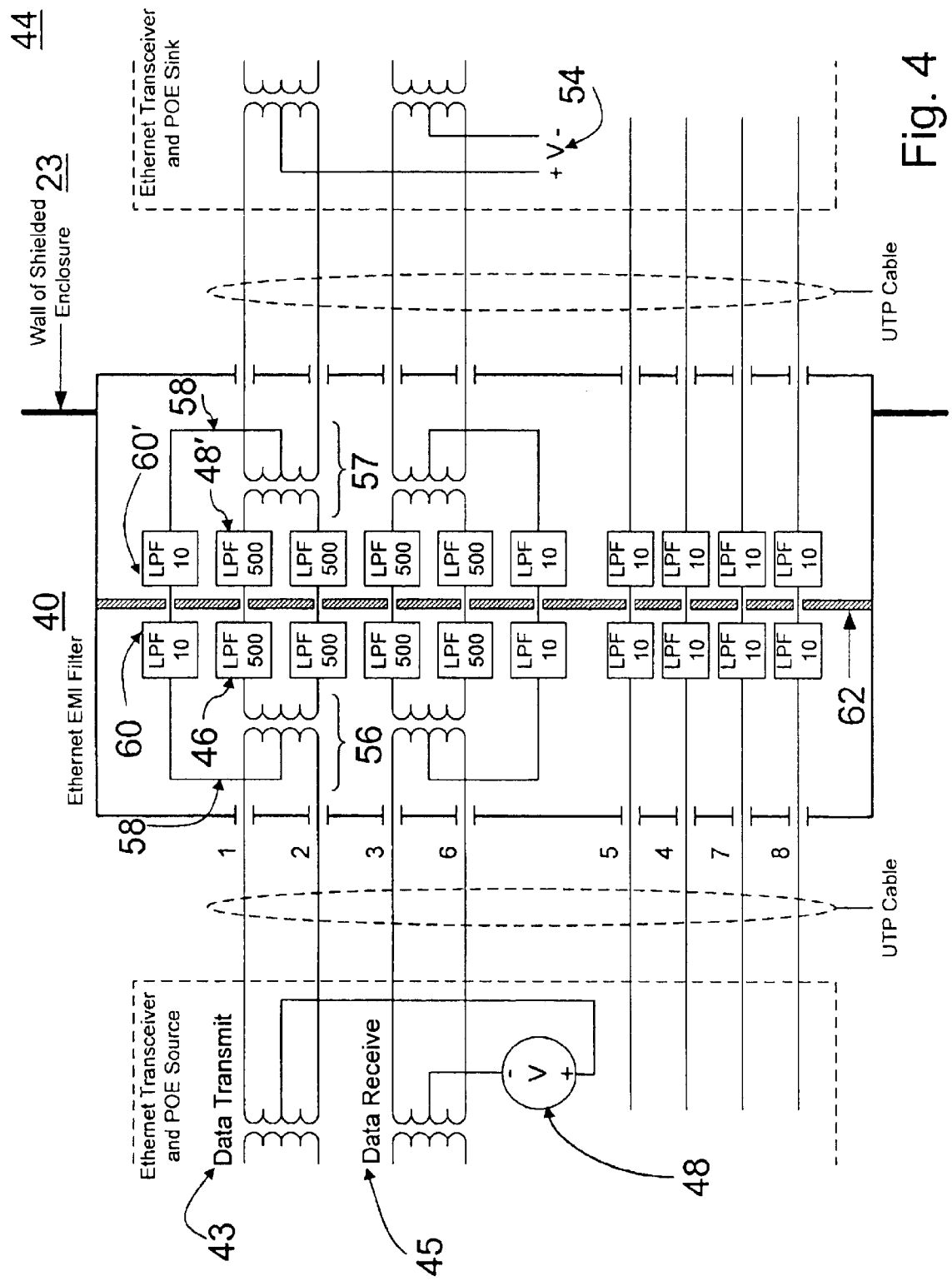
FIG. 4 illustrates an improved Ethernet interface circuit according to another embodiment of the present invention.

A novel setup to provide RFI filtering for Ethernet signals while also supporting Power Over Ethernet (POE) is shown in FIG. 4. This invention includes a circuit that meets the requirements economically and without resorting to impractical components or limitations. This embodiment of the RFI filter connects two Ethernet isolation transformers 56, 57 back-to-back through 500 MHz low pass filters 46 to simultaneously pass the desired Ethernet networking signal, while blocking the DC power used for POE. This allows commodity low-current filters 46 to be used for blocking RFI on the Ethernet signals. The power supply current for POE is coupled through the filter by connecting the center taps 58 of the two isolation transformers 56, 57 through a filter 60 capable of passing high current. Because only DC power is carried on this path, the filter cutoff can be very low. In this case, a commodity 10 MHz filter is shown because it has the required current capacity and is readily available off the shelf.

Standard Ethernet UTP consists of four wire pairs. For 100BASE-T, two pairs 43, 45 are used to pass the Ethernet signal, and for 802.3af-compliant POE, these same pairs are used to pass electric power 48. The remaining two pairs may be unconnected, however in reality, these conductors could be used for other purposes (for example, for nonstandard POE methods) and hence are connected and filtered in this embodiment. It should be noted that this technique can be used for 1000BaseT, which uses four pairs, by replication of the above design for all four pairs of wires. Other variations on the wiring usage are also within the scope of the invention. For this reason, the unused pairs are also filtered and passed through along with the primary two pairs, although this may be eliminated as needed.

For this embodiment, the enclosure includes an isolation wall 62, which serves to create two isolated chambers within the enclosure. By utilizing complementary low pass filters 46, 46' for the Ethernet signal and 60, 60' for the DC current, placed on opposite sides of the isolation wall 62, this design provides a high level of RFI isolation. Further, it is easy manufacture with two low pass filters 46 and 46', and 60 and 60' in series, because the two filters can be surface-mounted on the printed circuit board 62 PC board. However, it is within the scope of the invention to utilize single filter components 46 and 60 as the feed-through isolation devices, thereby using half the number of filter components, although the feedthrough style may require more difficult manufacturing steps.

Figure 5:
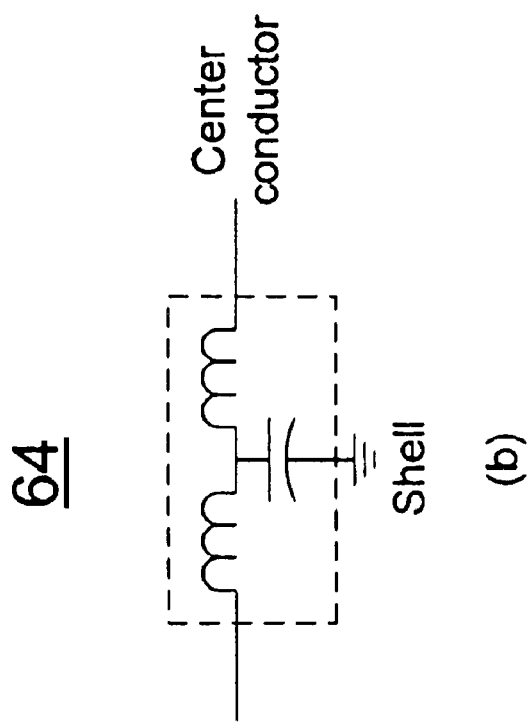
FIG. 5 illustrates some exemplary feed through components.
Figure 5:
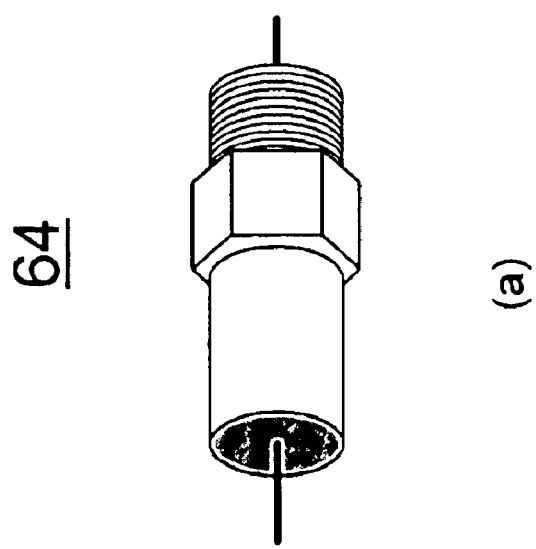

RFI filtering can be provided for a variety of electrical interfaces using a variety of standard techniques. One technique is through the use of feed-throughs, components 64 FIG. 5 that mount on a bulkhead to provide low pass filtering for the signal that passes through the component, as shown in FIG. 5a. The feed-through 64 is a T-topology LC low pass filter, as shown in FIG. 5b. The important feature of the feed-through 64 is that it provides a precisely-specified filtering while also being mounted with intimate contact to the bulkhead to block radiated emissions from passing. The cutoff frequency of the feed-through should be high enough to pass the desired signal, while suppressing the undesired.

Figure 6:
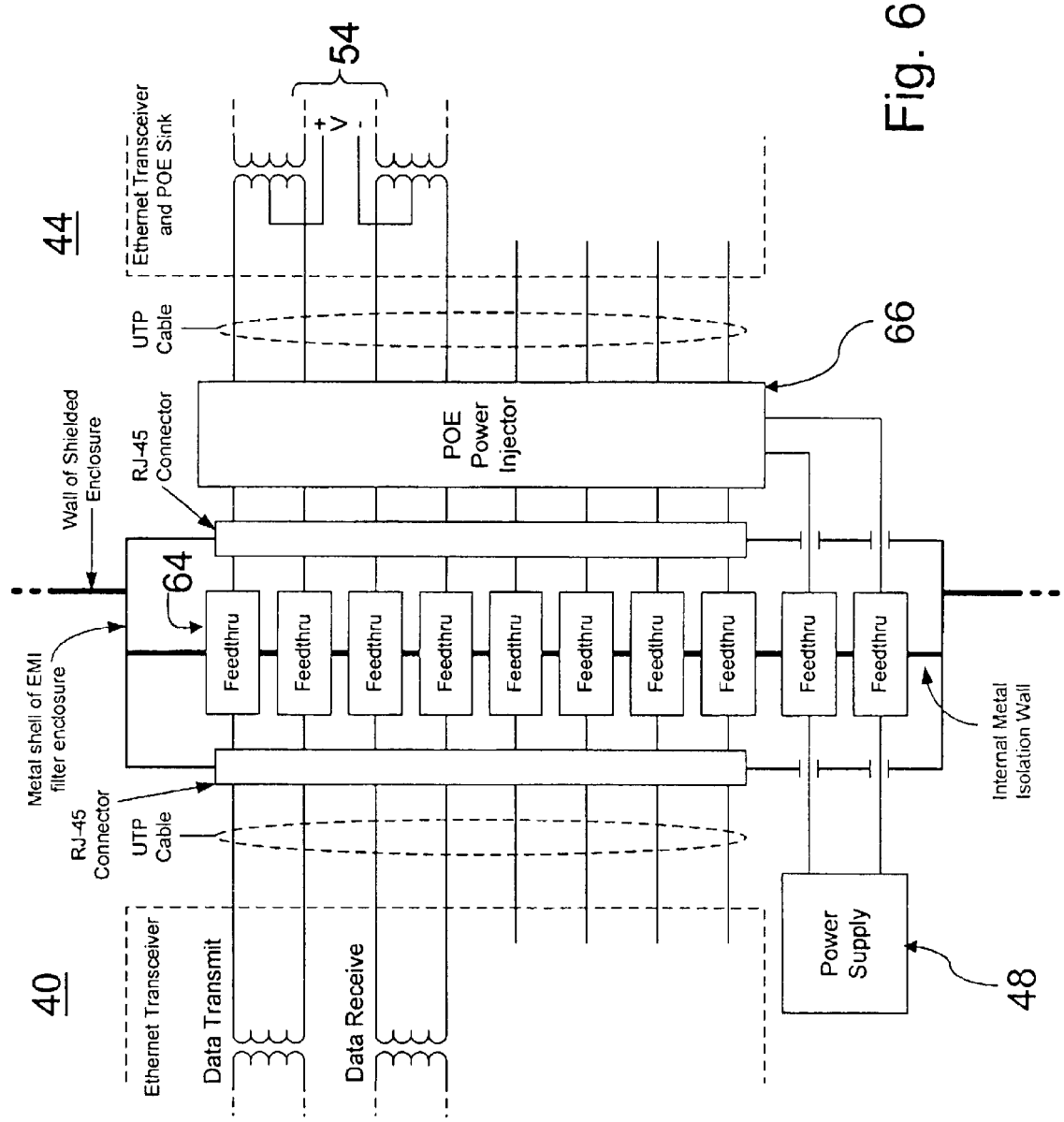
FIG. 6 illustrates another Ethernet interface circuit utilizing feed through components.

An embodiment providing RFI filtering for 10BASE-T Ethernet based on feedthrough design is shown in FIG. 6. For 10BASE-T Ethernet filtering, a cutoff frequency is in the range of 10 Mhz will work. This embodiment also shows how POE is typically handled: a filtered AC or DC power source 48 is brought into the enclosure to supply power to a commercially-available POE power injector 66.

A similar RFI filtering scheme can be used for the RS-232 serial interface. In this case, the power supply filtering is not necessary, as RS-232 conveys only signals. Likewise, this scheme can be applied to other interface types as well, including keyboard and mouse signals, USB, Firewire, PCI and VGA video.

Figure 7:
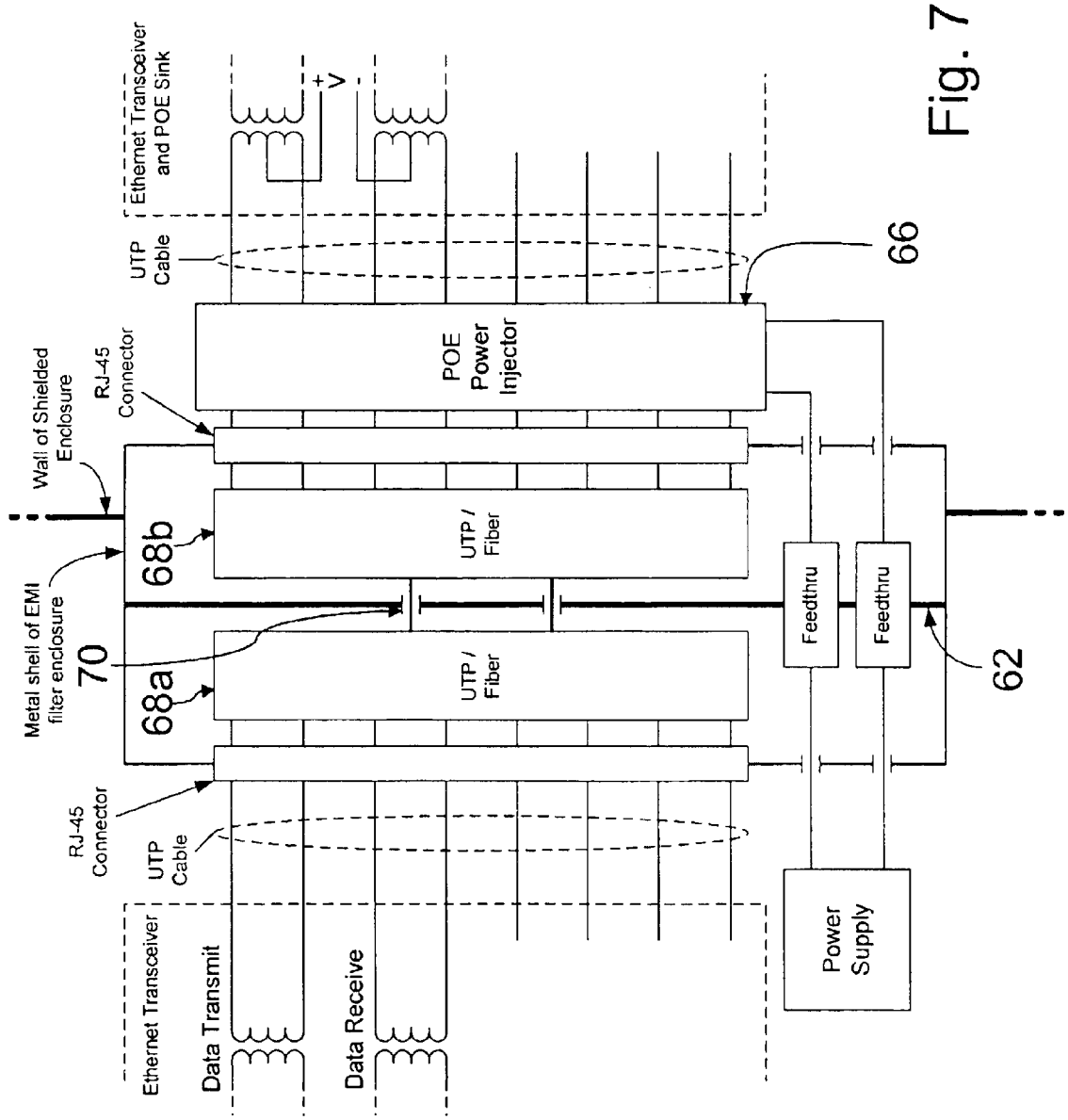
FIG. 7 illustrates yet another power over Ethernet interface circuit utilizing fiber optic feed through components.

Another method of RFI filtering is by conversion to optical signals, as depicted in FIG. 7. A readily available UTP/Fiber component 68a accepts signals from UTP on the wire side and provides transmit and receive fiber ports on the optical side. The optical fiber passes through a small aperture tunnel 70 that provides the necessary RFI suppression. POE is handled as previously described for the embodiment shown in FIG. 6. Circuitry for 100BASE-TX is shown for the embodiment in FIG. 7, but the scheme is applicable to all currently standardized Ethernet rates as well because there are commodity devices available to translate between the wired and fiber optic Ethernet standards. For 1000BASE-T, the transceivers on each endpoint would use all four pairs in the UTP cable.

Figure 8:
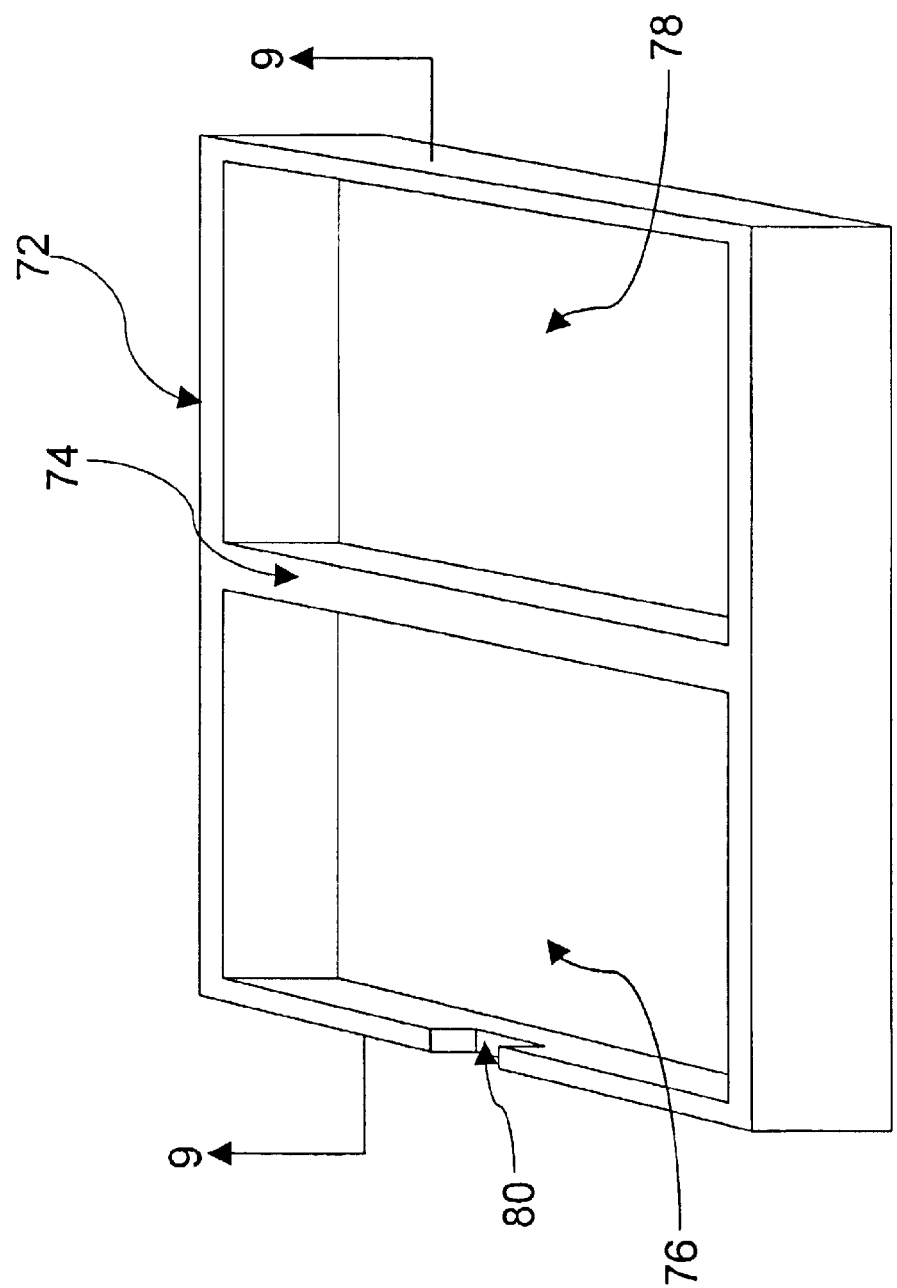
FIG. 8 illustrates features of a module according to one embodiment of the present invention.

Another feature of the present invention is the physical design of the isolation modules 22. The RFI isolation ability of the isolation modules 22 are augmented not only by the electrical circuit, but may also be augmented by the physical construction. According to an embodiment of the present invention, a module typically is composed of two identical metal shells that hold a printed circuit board between them. One such shell 72 is shown in FIG. 8. A wall 74 placed in the center divides the internal space into two chambers 76 and 78. On one edge there is a rectangular cutout 80 to provide a space for a female Ethernet RJ-45 connector.

Figure 9:
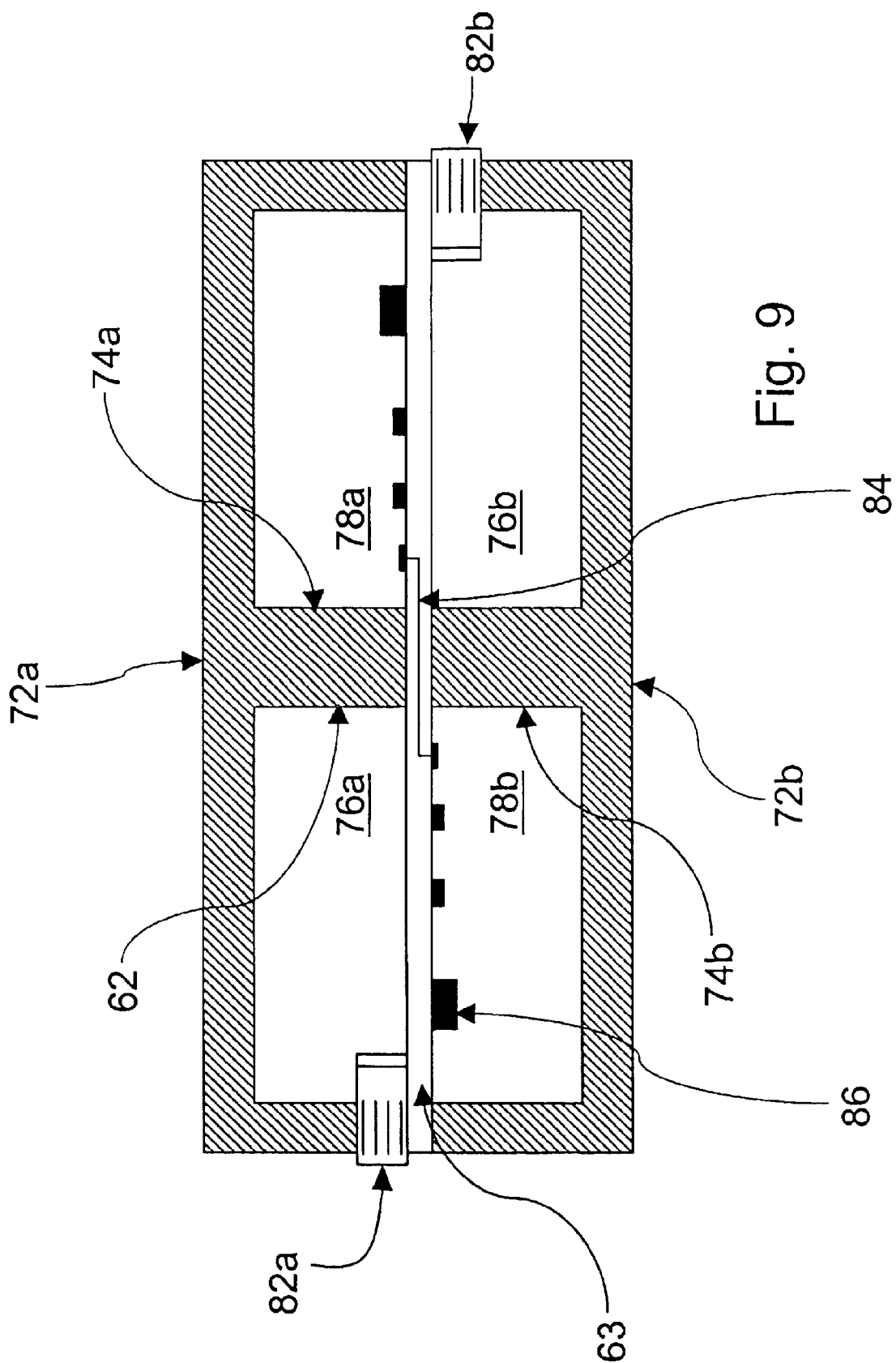
FIG. 9 illustrates an RF shielding setup of the module of FIG. 8.

FIG. 9 shows a cross-section of the assembled module, taken along the cutting plane line 9 shown in FIG. 8. The walls 74a and 74b form a grounded separation wall, which functions as an isolation wall 62. A printed circuit board 63 is sandwiched between the two metal shells 72a, 72b, and with the walls 74a and 74b creates four separate chambers, 76a and 78a, and 76b and 78b. Chambers 76a and 76b are not isolated very well from the outside of the module because RJ-45 connector shells 82 typically cannot provide sufficient isolation. However, chambers 78a and 78b are isolated by virtue of the continuous ground plane provided by the multilayer printed circuit board 62.

In operation, the Ethernet signal path passes from the connector 82a through the printed circuit board 62 to chamber 78b. In the illustrative embodiment, this chamber contains the circuitry illustrated in the left half of the filter module depicted in FIG. 4. The filtered signals then pass to chamber 78a FIG. 9, through paths 84 that are internal to the circuit board 63. The multilayer board 62 allows construction of a shielded "tunnel" 84 within the layers of the board. This allows the filtered signals to pass from chamber 78b to 78a through the isolation wall 62, without becoming recontaminated with RFI. The shielded tunnel 84 is formed by a pattern of vias that connect the ground plane layers (the top and bottom layers) of the PC (printed circuit) board 63. The via pattern runs parallel to the printed circuit board signal trace with a spacing close enough (smaller than one tenth of a wavelength) to create a virtual Faraday cage around the signal trace.

The via pattern is continued around the edges of the printed circuit board 63 and along the middle where the dividing wall 74 is placed. With the top and bottom ground plane layers, this provides a shield along all six sides of the PC board and prevents RFI from leaking into the shielded chambers.

This design provides for a high level of RFI isolation. The two chambers 76a and 76b can include a high level of RFI, while the other chambers 78a and 78b are properly isolated from the 'noisy' chambers, and also from each other. This multi-chamber sequential design guarantees excellent isolation of any RFI.

In this embodiment, an Ethernet transformer 86 is mounted within chamber 78b, and it is possible for RFI conducted into this chamber on the Ethernet pairs to be reradiated by the leads on the primary side of the Ethernet transformer 86. However, this is insignificant because the transformer 86 leads are much shorter than the wavelengths of interest. It is also possible that what little signal is re-radiated can be picked up by the leads on the secondary side of the transformer 86; however, this is also insignificant for the same reason. The transformer 86 itself provides some suppression of conducted RF because it is designed to pass Ethernet signals, not wireless LAN carrier signals.

Figure 10:
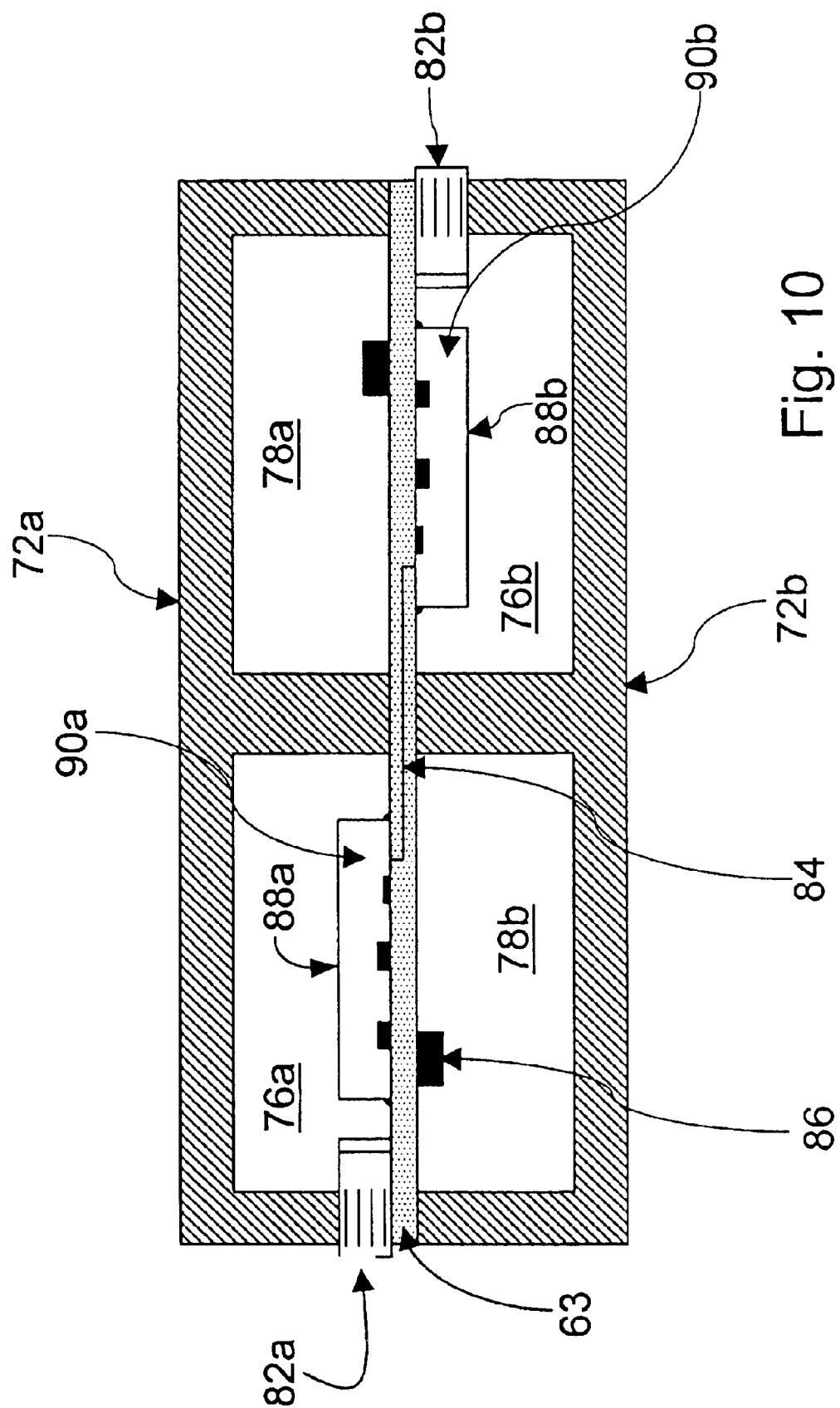
FIG. 10 illustrates a different embodiment of the module of FIG. 9.

FIG. 10 shows another embodiment of an isolation module with even further RF isolation, in which the PC board 62 includes metal enclosures 88 (often referred to as "cans") placed over one or more components on the PC board 62. Here, the Ethernet transformer 86 is also isolated. The transformer 86 output signals pass to the other side of the PC board 62 again, but re-emerge under a metal can 88 soldered to the surface of the PC board. The can 88 and the ground plane of the PC board 62 form a third enclosure 90a, isolated from chambers 76a and 76b to shield the low-pass filter components within enclosure 90a. Conducted RF might also be reradiated by the short contacts on the filters, however, in practice this is completely negligible, for similar reasons as described above.

For the embodiment shown in FIG. 10, the Ethernet signal coming in through connector 82a within the chamber 76a, then passes through the PC board 62 (and ground plane) into the chamber 78b, then back through PC board 62 into chamber 90a. The signal then passes through shielded tunnel path 84 to chamber 90b. Continuing on, the signal passes to chamber 78a, then to 76b, and finally exits through the connector 82b. This design provides multiple isolation chambers to prevent any RFI, included re-radiated RF signals from circuit components, while allowing the Ethernet signal to pass in both directions.

Although the multiple isolation chamber module has been described in terms of 10 Ethernet signal interface, this scheme can be applied to other interface types as well. Further, additional walls 74 may be included in the module shell 72, thereby creating more than four chambers when assembled with a circuit board 62 and another module shell 72.

Although the invention has been shown and described with respect to illustrative embodiments thereof, various other changes, omissions and additions in the form and detail thereof may be made therein without departing from the spirit and scope of the invention.

What is claimed is:

1. An enclosure for RF isolation of a space inside said enclosure from space outside said enclosure, comprising:
   an access door on said enclosure, said access door providing access to said space inside said enclosure;
   at least one interface module on said enclosure, said interface module including at least one path for signals to pass from said space outside said enclosure to said space inside said enclosure, wherein said interface module maintains RF isolation of at least one frequency band of said space inside said enclosure from said space outside said enclosure; and
   wherein said interface module is removably mountable on said enclosure.

2. The enclosure of claim 1, wherein said at least one interface module is removed and replaced by a second interface module, said second interface module including at least one path for signals that are different from said removed interface module.

3. The enclosure of claim 1 further including a separation wall disposed within said space inside said enclosure, said separation wall dividing said space inside said enclosure into two separate, RF isolated chambers.

4. The enclosure of claim 3 further including a first and second interface module, wherein said first interface module provides access to a first RF isolated chamber, and said second interface module provides access to a second RF isolated chamber.

5. The enclosure of claim 1, further including at least one RF connection port, to provide a path for RF signals to pass between said space outside said enclosure and said space inside said enclosure.

6. The enclosure of claim 1, wherein said interface module passes signals selected from the group of: Ethernet, Ethernet with POE (Power Over Ethernet), RS-232 serial link, VGA/SVGA video display link, PS-2 PC keyboard, PS-2 PC mouse, Universal Serial Bus (USB), IEEE-1394 ("Firewire") high speed serial interface, telephony signals, AC electric power, DC electric power, signals for logic analyzers, spectrum analyzers, oscilloscopes, digital diagnostic interface, background debug mode, fiber optic signal paths, and environmental measurements.

7. The enclosure of claim 1, including an alternative interface module without at least one signal path, said alternative interface module including a mesh grid to allow air flow into said enclosure while maintaining RF isolation.

8. An interface module, for passing a preselected signal, comprising:
a first interface connection, to connect to a signal path for said predetermined signal located outside of an RF isolation chamber;
a second interface connection, to connect to a signal path for said predetermined signal located within said RF isolation chamber;
at least one signal path connecting said first and second interface connections, wherein said at least one signal path includes RF filtering components;
a mounting component, to provide for mounting said interface module to said RF isolation chamber, wherein when said interface module is mounted to said RF isolation chamber, said second interface connection is accessible from inside said RF isolation chamber, and wherein when said interface module is mounted to said RF isolation chamber, said interface module provides at least some RF isolation between outside and inside said RF isolation chamber.

9. The interface module of claim 8, wherein said at least one signal path passes signals selected from the group of: Ethernet, Ethernet with POE (Power Over Ethernet), RS-232 serial link, VGA/SVGA video display link, PS-2 PC keyboard, PS-2 PC mouse, Universal Serial Bus (USB), IEEE-1394("Firewire") high speed serial interface, telephony signals, AC electric power, DC electric power, signals for logic analyzers, spectrum analyzers, oscilloscopes, digital diagnostic interface, background debug mode, fiber optic signal paths, and environmental measurements.

10. The interface module of claim 8, wherein said interface module includes a mesh grid to allow air flow into said enclosure while maintaining RF isolation.

11. The interface module of claim 8, wherein said at least one signal path passes through a plurality of separate RF isolation chambers within said interface module.

12. The interface module of claim 11 further including a printed circuit board including a ground plane, wherein said printed circuit board is positioned within said interface module as to divide an internal space of said interface module into a plurality of separate RF isolation chambers.

13. The interface module of claim 12 wherein said printed circuit board includes pass through vias to allow said signal path to pass from one side of said printed circuit board to the other side.

14. The interface module of claim 13 wherein said vias provide an RF isolation tunnel.

15. A system for interconnecting multiple electrical signal paths while providing RF isolation, comprising:
a first connector, to connect to a plurality of electrical signal paths;
a second connector, to connect to a second plurality of electrical signal paths;
a first signal path from said first connector to a first isolation transformer component, wherein said first signal path, after passing through said first isolation transformer component, then passes through a low pass filter component, and wherein said signal path continues to a second isolation transformer component, and, after passing through said second isolation transformer component, said signal path connects to said second connector; and
wherein a center tap on said first isolation transformer component includes a second signal path through a low pass filter component, and then to a center tap on said second isolation transformer component.

16. The system of claim 15 wherein said first signal path, after passing through said first isolation transformer component, then passes through a first low pass filter component, then passes through an isolation wall, then through a second low pass filter component, and then continues to said second isolation transformer component.

17. The system of claim 16 wherein said first signal path passes through a plurality of RF isolation chambers, and wherein said first and second isolation transformer components and said first and second low pass filter components are positioned in separate ones of said plurality of RF isolation chambers.

18. The system of claim 17 wherein said first and second connector, said first and second isolation transformer components and said first and second low pass filter components are positioned in separate ones of said plurality of RF isolation chambers.

19. The system of claim 15 wherein said second signal path passes through a first low pass filter component, then through an isolation wall, then through a second low pass filter component, and then continues to said center tap on said second isolation transformer component.

20. The system of claim 15 wherein said low pass filter component on said first signal path includes a cutoff frequency higher than a cutoff frequency on said low pass filter component on said second signal path.

21. The system of claim 15 wherein said second signal path allows a DC current to pass through said system.

22. The system of claim 15 wherein said plurality of electrical signal paths allow POE (power over Ethernet) signals to pass through said system.

23. The system of claim 15 wherein said first and second isolation transformer components are isolated from other components by placement within RF isolation chambers.

24. The system of claim 15 wherein said low pass filter component on said second signal path includes an off the shelf low pass filter.

25. The system of claim 15 wherein said first signal path passes through a plurality of RF isolation chambers, and wherein said first and second isolation transformer components are positioned in separate ones of said plurality of RF isolation chambers.

26. The system of claim 25 wherein said low pass filter component is positioned in one said plurality of RF isolation chambers separate from said first and second isolation transformer components.

27. The system of claim 26 wherein said first and second connectors are each positioned in an RF isolation chamber separate from said first and second isolation transformer components and said low pass filter component.

28. A method for providing multiple electrical signal paths while blocking RF interference, comprising:
providing a first signal path through a first isolation transformer component, wherein said first signal path, after passing through said first isolation transformer component, then passes through a low pass filter component, and wherein said signal path continues to a second isolation transformer component; and
providing a second signal path from a center tap on said first isolation transformer component, through a low pass filter component, and then to a center tap on said second isolation transformer component.

29. The method of claim 28 wherein said first signal path, after passing through said first isolation transformer component, then passes through a first low pass filter component, then passes through an isolation wall, then through a second low pass filter component, and then continues to said second isolation transformer component.

30. The method of claim 28 wherein said second signal path, passes through a first low pass filter component, then through an isolation wall, then through a second low pass filter component, and then continues to center tap on said second isolation transformer component.

31. The method of claim 28 wherein said low pass filter component on said first signal path includes a cutoff frequency higher than a cutoff frequency on said low pass filter component on said second signal path.

32. The method of claim 28 wherein said second signal path allows a DC current to pass through said system.

33. The method of claim 28 wherein said plurality of electrical signal paths allow POE (power over Ethernet) signals to pass through said system.

34. The method of claim 28 wherein said first and second isolation transformer components are isolated from other components by placement within RF isolation chambers.

35. The method of claim 28 wherein said low pass filter component on said second signal path includes an off the shelf low pass filter.

36. The method of claim 28 including providing a plurality of RF isolation chambers, wherein said first signal path passes through said plurality of RF isolation chambers, and wherein said first and second isolation transformer components are positioned in separate ones of said plurality of RF isolation chambers.

37. The method of claim 36 wherein said low pass filter component is positioned in one of said plurality of RF isolation chambers separate from said first and second isolation transformer components.

38. The method of claim 37 wherein said first and second connectors are each positioned in an RF isolation chamber separate from said first and second isolation transformer components and said low pass filter component.

39. The method of claim 28 including providing a plurality of RF isolation chambers, wherein said first signal path passes through said plurality of RF isolation chambers, and wherein said first and second isolation transformer components and said first and second low pass filter components are positioned in separate ones of said plurality of RF isolation chambers.

40. The method of claim 39 wherein said first and second connector, said first and second isolation transformer components and said first and second low pass filter components are positioned in separate ones of said plurality of RF isolation chambers.

41. An interface module, for passing a predetermined signal without RFI, comprising:
a plurality of internal chambers, said chambers including RF isolating walls;
a signal path, passing through each of said plurality of internal chambers; and
RF filtering components along said signal path, wherein said RF filtering components are located in different ones of said plurality of internal chambers.

42. The interface module of claim 41, further including a printed circuit board including a ground plane, wherein said printed circuit board forms one of said RF isolating walls to at least one of said plurality of internal chambers.

43. The interface module of claim 42 wherein said printed circuit board includes pass through vias to create shielded tunnels to allow said signal path to pass from one of said internal chambers to another internal chamber.

44. The interface module of claim 42 wherein said interface module is formed using two identical shell components, wherein said shell components are positioned together with said printed circuit board in between, thereby creating said plurality of internal chambers.

* * * * *

UNITED STATES PATENT AND TRADEMARK OFFICE
CERTIFICATE OF CORRECTION

PATENT NO. : 6,903,910 B1
DATED : June 7, 2005
INVENTOR(S) : Griesing et al.

It is certified that error appears in the above-identified patent and that said Letters Patent is hereby corrected as shown below:

Title page,
Item [73], Assignee, should read -- Azimuth Networks, Inc., Acton, MA (US) --

Signed and Sealed this

Twelfth Day of July, 2005

JON W. DUDAS
*Director of the United States Patent and Trademark Office*